(12) United States Patent
Anzou et al.

(10) Patent No.: US 10,261,127 B2
(45) Date of Patent: Apr. 16, 2019

(54) SEMICONDUCTOR INTEGRATED CIRCUIT

(71) Applicant: Kabushiki Kaisha Toshiba, Minato-ku, Tokyo (JP)

(72) Inventors: Kenichi Anzou, Kawasaki Kanagawa (JP); Toshiaki Dozaka, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 15/700,975

(22) Filed: Sep. 11, 2017

(65) Prior Publication Data
US 2018/0238965 A1 Aug. 23, 2018

(30) Foreign Application Priority Data

Feb. 21, 2017 (JP) ................................ 2017-030114

(51) Int. Cl.

| | | |
|---|---|---|
| *G01R 31/317* | (2006.01) | |
| *G01R 31/3177* | (2006.01) | |
| *G11C 11/418* | (2006.01) | |
| *G11C 11/419* | (2006.01) | |
| *G11C 29/12* | (2006.01) | |
| *G11C 29/32* | (2006.01) | |

(Continued)

(52) U.S. Cl.
CPC ... *G01R 31/31725* (2013.01); *G01R 31/3177* (2013.01); *G11C 11/418* (2013.01); *G11C 11/419* (2013.01); *G11C 29/12015* (2013.01); *G11C 29/32* (2013.01); *G11C 29/54* (2013.01); *G11C 2029/0403* (2013.01); *G11C 2029/3202* (2013.01); *H03K 3/0372* (2013.01)

(58) Field of Classification Search
CPC .......... G01R 31/31725; G01R 31/3177; G11C 11/418; G11C 11/419; G11C 29/12015; G11C 29/32; G11C 29/54; G11C 2029/0403; G11C 2029/3202; H03K 3/0372
USPC ......... 714/731, 726, 729, 718; 365/200, 201
See application file for complete search history.

(56) References Cited

U.S. PATENT DOCUMENTS 5,204,560 A * 4/1993 Bredin .................. G11C 7/067
327/202
8,553,482 B2 * 10/2013 Chow .................... G11C 7/08
365/189.02

(Continued)

FOREIGN PATENT DOCUMENTS

JP  H10-160801 A  6/1998
JP  2003-107133 A  4/2003

(Continued)

*Primary Examiner* — John J Tabone, Jr.
(74) *Attorney, Agent, or Firm* — White & Case LLP

(57) ABSTRACT

According to one embodiment, a semiconductor integrated circuit includes a logic circuit and a memory macro. The memory macro includes: a memory cell array including a memory bit cell; an output buffer; a sense amplifier configured to output data read from the memory cell array based on a first clock signal; a write driver configured to apply a write voltage; and a first register circuit that configured to fetch first input data based on a second clock signal, output the first input data to the write driver based on the second clock signal in a write operation, and outputs the first input data to the output buffer based on the first clock signal in a scan test of the logic circuit.

16 Claims, 7 Drawing Sheets

(51) Int. Cl.
*H03K 3/037* (2006.01)
*G11C 29/54* (2006.01)
*G11C 29/04* (2006.01)

(56) References Cited

U.S. PATENT DOCUMENTS

| | | | | |
|---|---|---|---|---|
| 9,666,302 | B1* | 5/2017 | Chang | G11C 7/10 |
| 2001/0048630 | A1* | 12/2001 | Fujimoto | G11C 8/06 |
| | | | | 365/230.03 |
| 2003/0063495 | A1 | 4/2003 | Fukuda | |
| 2003/0086320 | A1* | 5/2003 | Fujimoto | G11C 8/06 |
| | | | | 365/200 |
| 2005/0254317 | A1* | 11/2005 | Chan | G11C 7/08 |
| | | | | 365/194 |
| 2011/0072323 | A1 | 3/2011 | Chong et al. | |
| 2017/0352399 | A1* | 12/2017 | Yokoyama | G11C 29/024 |

FOREIGN PATENT DOCUMENTS

| | | | |
|---|---|---|---|
| JP | 2006-337289 A | 12/2006 | |
| JP | 5441857 B2 | 3/2014 | |
| JP | 5661143 B2 | 1/2015 | |

* cited by examiner

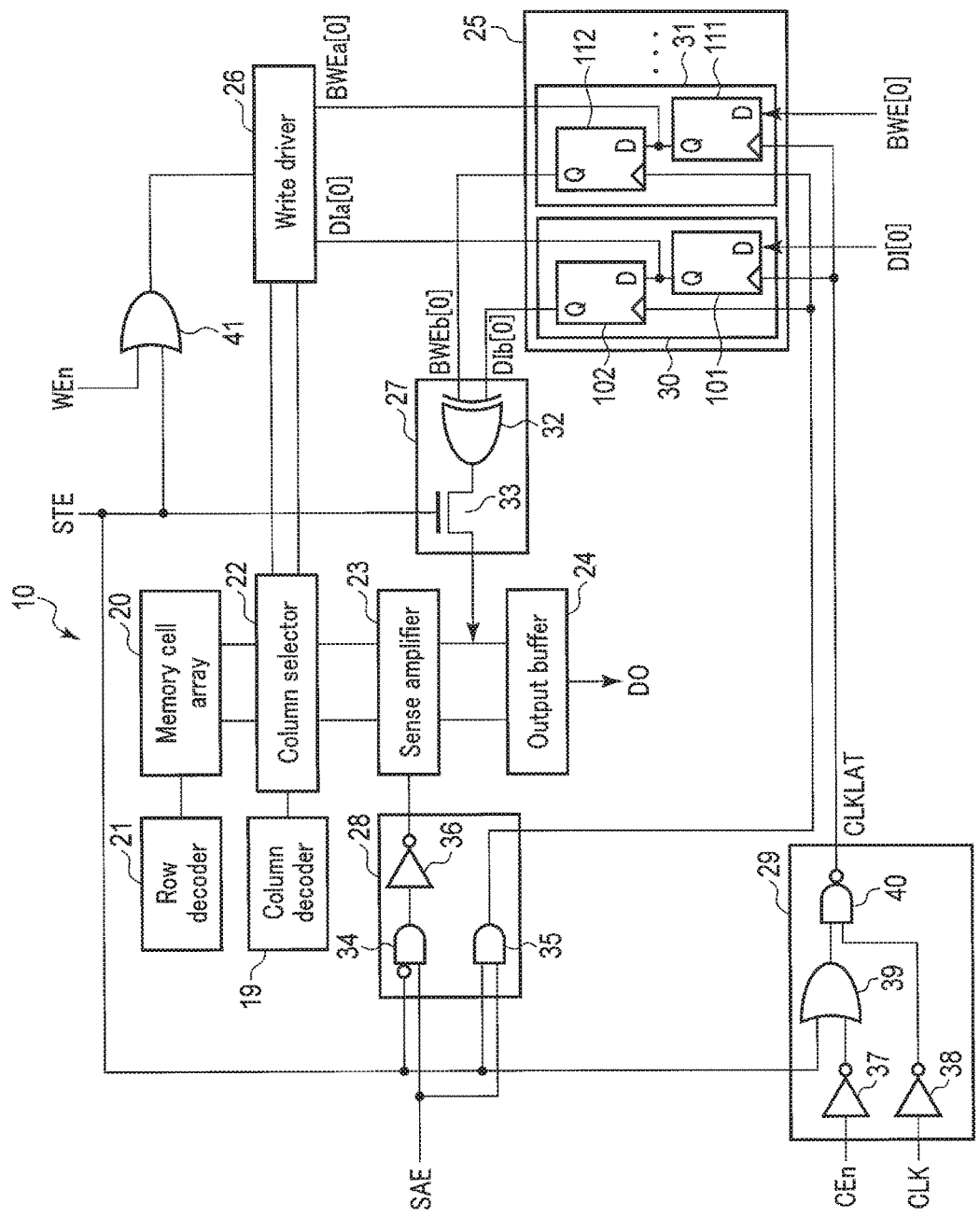
F I G. 2

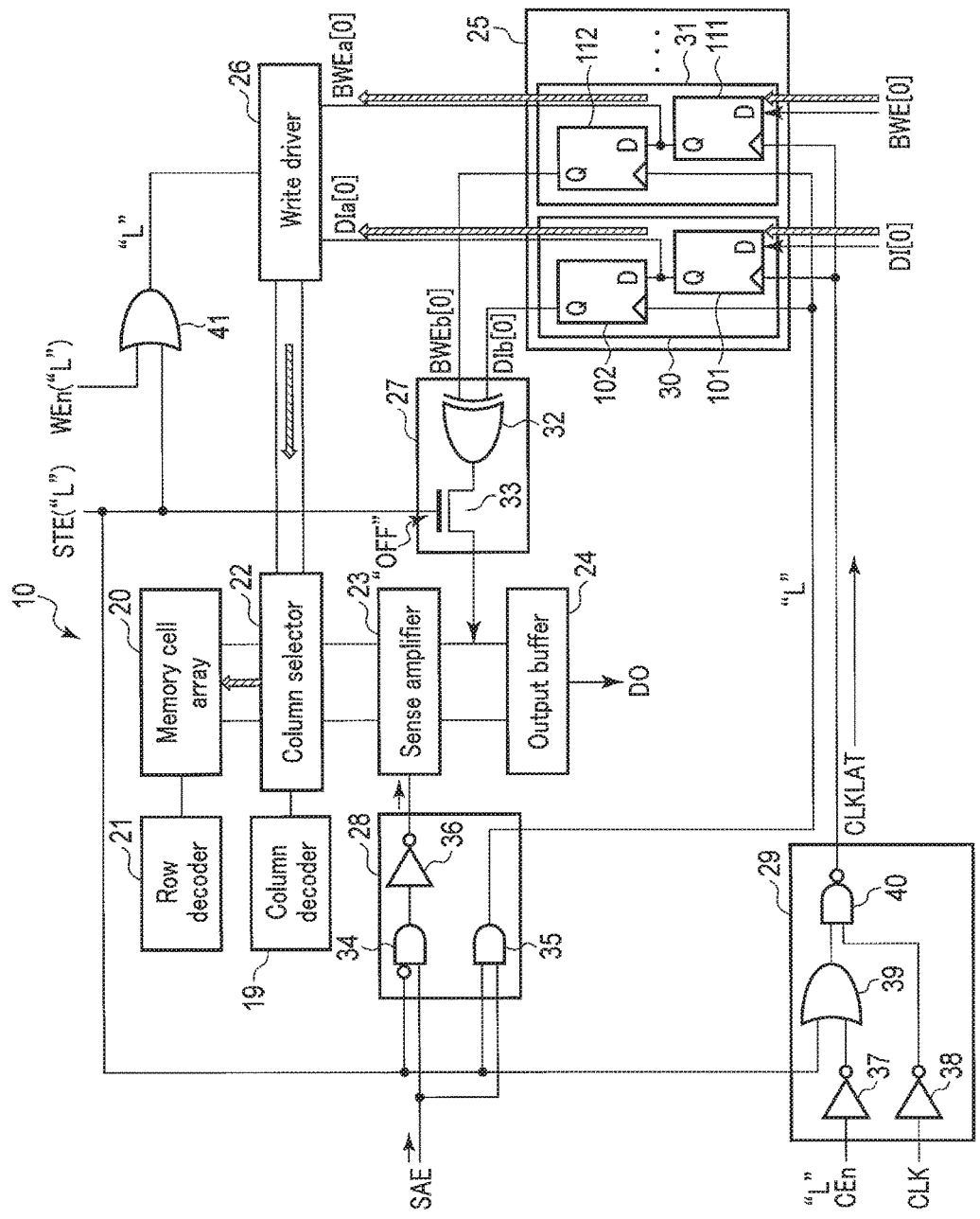
F I G. 4

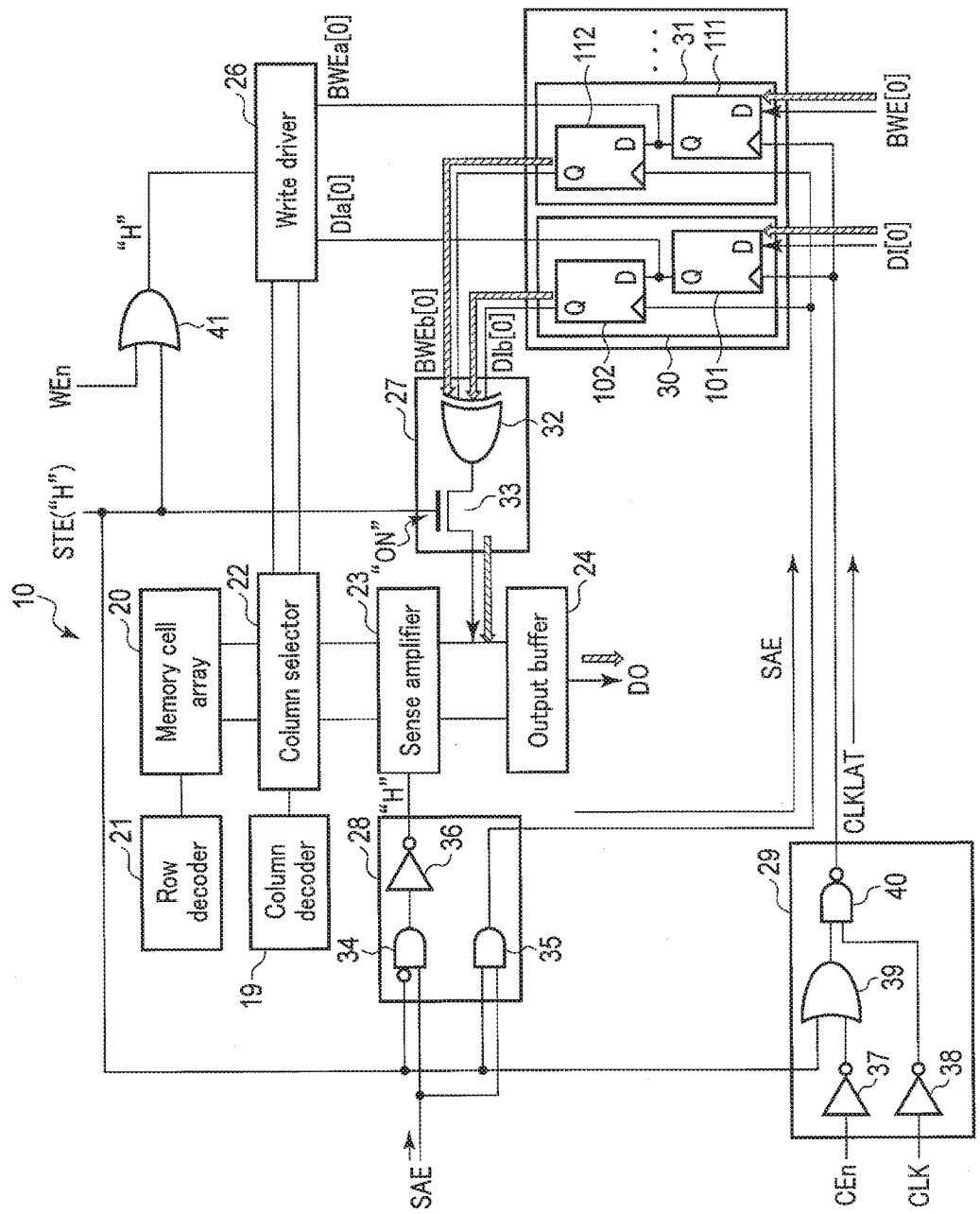
F I G. 5

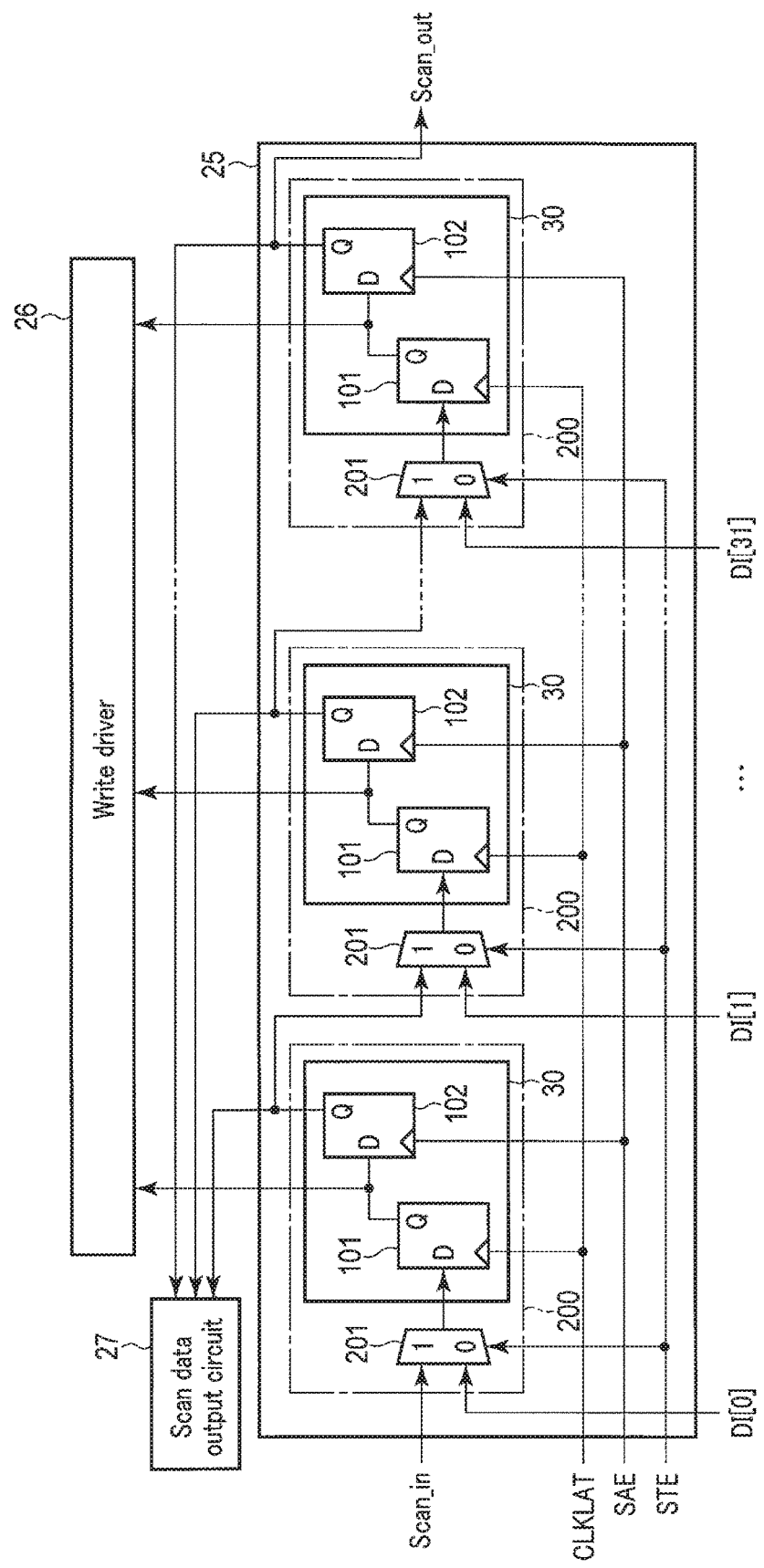
F I G. 7

SEMICONDUCTOR INTEGRATED CIRCUIT

CROSS-REFERENCE TO RELATED APPLICATIONS

This application is based upon and claims the benefit of priority from Japanese Patent Application No. 2017-030114, filed Feb. 21, 2017, the entire contents of which are incorporated herein by reference.

FIELD

Embodiments described herein relate generally to a semiconductor integrated circuit.

BACKGROUND

In a semiconductor integrated circuit which incorporates an SRAM (Static Random Access Memory), a data path in normal operation using the SRAM differs from that in a scan test of a logic circuit around the SRAM.

BRIEF DESCRIPTION OF THE DRAWINGS

FIG. 2 is a block diagram of a memory macro included in the semiconductor integrated circuit according to the first embodiment;

FIG. 4 is a view showing the operation in a normal mode of the semiconductor integrated circuit according to the first embodiment;

FIG. 5 is a view showing the operation in a scan mode of the semiconductor integrated circuit according to the first embodiment;

FIG. 7 is a block diagram of latch circuit included in a semiconductor integrated circuit according to a third embodiment.

DETAILED DESCRIPTION

In general, according to one embodiment, a semiconductor integrated circuit includes: a logic circuit; and a memory macro coupled to the logic circuit. The memory macro includes: a memory cell array including a memory bit cell; an output buffer coupled to the logic circuit; a sense amplifier configured to output data read from the memory cell array to the output buffer based on a first clock signal; a write driver configured to apply a write voltage to the memory cell array based on an asserted write control signal; and a first register circuit that configured to fetch first input data from the logic circuit based on a second clock signal, output the first input data to the write driver based on the second clock signal in a write operation based on the asserted write control signal, and output the first input data to the output buffer based on the first clock signal in a scan test of the logic circuit.

1. First Embodiment

A semiconductor integrated circuit according to the first embodiment will be described. A case where the semiconductor integrated circuit incorporates an SRAM (Static Random Access Memory) will be described below as an example.

1.1 Configuration of Semiconductor Integrated Circuit

First, the configuration of the semiconductor integrated circuit will be described with reference to FIG. 1. A semiconductor integrated circuit 1 according to this embodiment has a scan test function for testing a logic circuit (sequential circuit) which is provided outside a memory macro. In a scan test, a post-manufacture test of the logic circuit is performed on a plurality of flip-flop circuits that are coupled in serial to each other in the logic circuit by using scan data input from an external device, and whether or not there is a manufacturing defect in the logic circuit is determined according to the result of the output thereof. A fault diagnosis is also performed, as necessary. Hereinafter, in this embodiment, a period of performing the scan test is called a "scan mode," and a normal system operation period when a memory is accessible is called a "normal operation mode." An LBIST (logic built in self-test) circuit may be incorporated in the semiconductor integrated circuit 1, so that a built-in self-test of the logic circuit is performed regularly.

Figure 1:
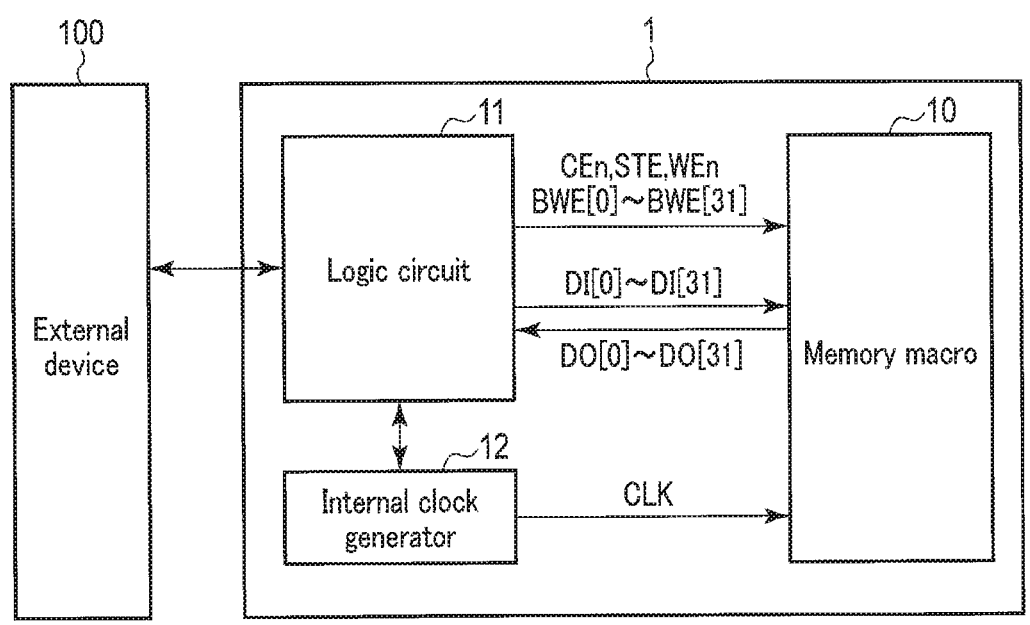
FIG. 1 is a block diagram of a semiconductor integrated circuit according to a first embodiment.

The semiconductor integrated circuit 1 includes a memory macro 10, a logic circuit 11, and an internal clock generator 12, as shown in FIG. 1. The example in FIG. 1 shows a case where 32-bit data transmission/reception is performed between the logic circuit 11 and the memory macro 10; however, any number of bits may be set. Also, the example in FIG. 1 shows a part of lines (or buses) that couples respective blocks.

The memory macro 10 temporarily stores information (data, address, program, etc.) necessary for the logic circuit 11 to perform various kinds of calculations, and transmits/receives this information to/from the logic circuit 11. The memory macro 10 includes a plurality of SRAM bit cells, a sense amplifier, a write driver, etc., that are described below. A plurality of memory macros may be provided.

In response to an instruction of an external device 100, the logic circuit 11 performs logic operation for the semiconductor integrated circuit 1 to perform various kinds of processing. The logic circuit 11 includes a plurality of flip-flop circuits (not shown) used for the logic operation. At the time of the scan test, the plurality of flip-flop circuits which are coupled in serial to each other in the logic circuit 11 perform a shifting operation according to a scan shift enable signal for performing data shifting.

The logic circuit 11 transmits a chip enable signal CEn, a write enable signal WEn, a scan test enable signal STE, a bit write enable signal BWE, and an address signal to the memory macro 10 according to a command received from the external device 100. In the memory macro 10, a sense amplifier enable signal SAE is generated by a timing of a state ("H") of the write enable signal WEn and a clock signal.

The sense amplifier enable signal SAE is a clock signal that controls the timing at which the sense amplifier included in the memory macro 10 reads data. The chip enable signal CEn is a signal for enabling the operation of writing to or reading from the memory macro 10 to be accessed, and is asserted, for example, at an "L" ("Low") level. The write enable signal WEn is a signal for enabling the write operation, and is asserted, for example, at an "L" level. The scan test enable signal STE is asserted, for example, at an "H" ("High") level when the scan test is performed. The bit write enable signal BWE is a signal that instructs writing of data to the memory macro 10 for each bit. For example, if the transmission/reception of 32-bit data is performed between the logic circuit 11 and the memory macro 10, the bit write enable signals BWE[0] to BWE[31] are provided in accordance with the number of bits (the number of data bits), namely, the number of data lines to transmit write data from the logic circuit 11 to the memory macro 10.

The logic circuit 11 transmits/receives data to/from the memory macro 10. For example, write data or scan data is transmitted from the logic circuit 11 to the memory macro 10 (hereinafter called "input data"). Also, read data or scan data is transmitted from the memory macro 10 to the logic circuit 11 (hereinafter called "output data"). Hereinafter, the input data is indicated as DI[0] to DI[31] in accordance with the number of input data lines that couple the logic circuit 11 with the memory macro 10. Likewise, the output data is indicated as DO[0] to DO[31] in accordance with the number of output data lines that couple the logic circuit 11 with the memory macro 10. In the case of not specifying data DI[0] to DI[31], the data is indicated as data DI, and in the case of not specifying data DO[0] to DO[31], the data is indicated as data DO. The number of data lines may be changed at will according to the number of bits of the data transmitted/received between the logic circuit 11 and the memory macro 10.

By the control of the logic circuit 11, the internal clock generator 12 generates various clock signals used internally based on an external clock input from the external device 100. For example, the internal clock generator 12 transmits a clock signal CLK to the memory macro 10.

1.2 Configuration of Memory Macro

Next, the configuration of the memory macro 10 will be described with reference to FIG. 2. In the descriptions provided below, one end of a transistor indicates one of a source or a drain, and the other end of the transistor indicates the other of the source or the drain.

As shown in FIG. 2, the memory macro 10 includes a memory cell array 20, a row decoder 21, a column decoder 19, a column selector 22, a sense amplifier 23, an output buffer 24, an input latch 25, a write driver 26, a scan data output circuit (alternatively called a scan data propagation controller) 27, an SAE selector (alternatively called an SAE propagation controller) 28, a CLK controller 29, and an OR circuit 41. In the example shown in FIG. 2, only the flip-flop circuits that correspond to the data DI[0] and the bit write enable signal BWE[0] are indicated in the input latch 25, to simplify the description. The other flip-flop circuits corresponding to the data DI[1] to DI[31] and the bit write enable signals BWE[1] to BWE[31] also have the same configuration.

The memory cell array 20 comprises a plurality of SRAM bit cells (not shown) that are arranged two-dimensionally in a row direction and a column direction. Details of the memory cell array 20 will be described later.

The row decoder 21 decodes a row address, and selects one of the rows, namely word lines WL in the memory cell array 20 based on the result of the decoding. The row address is provided from the logic circuit 11, for example.

The column decoder 19 decodes a column address, and transmits the result of the decoding to the column selector 22. The column address is provided from the logic circuit 11, for example.

The column selector 22 selects a column in the memory cell array 20. More specifically, the column selector 22 selects one of the columns in the memory cell array 20, namely one of a plurality of bit line pairs extending in the column direction of the memory cell array 20, according to a column address received from a column decoder 19, for example. Then, the column selector 22 couples the selected bit line pair with the sense amplifier 23 or the write driver 26. The column address is provided from the logic circuit 11, for example.

The sense amplifier 23 reads the data stored in the SRAM bit cell in the memory cell array 20. According to the sense amplifier enable signal SAE generated by the timing of the state ("H") of the write enable signal WEn and the clock signal, the sense amplifier 23 amplifies the data read from the selected bit line pair and transmits it to the output buffer 24.

The output buffer 24 temporarily stores the data received from the sense amplifier 23. The data stored in the output buffer 24 is transmitted to the logic circuit 11 as the data DO (DO[0] to DO[31]). For example, the output buffer 24 includes 32 registers corresponding to 32-bit data DO.

The input latch 25 temporarily stores the data DI (DI[0] to DI[31]) and the bit write enable signal BWE (BWE[0] to BWE[31]) received from the logic circuit 11. The input latch 25 fetches the data DI and the bit write enable signal BWE based on the clock signal CLKLAT. The input latch 25 outputs the data DI and the bit write enable signal BWE to the write driver 26 based on the clock signal CLKLAT. Also, the input latch 25 outputs the data DI and the bit write enable signal BWE to the scan data output circuit 27 based on the sense amplifier enable signal SAE. Hereinafter, the data transmitted to the write driver 26 is indicated as "DIa," and the bit write enable signal transmitted to the write driver 26 is indicated as "BWEa". Likewise, the data transmitted to the scan data output circuit 27 is indicated as "DIb," and the bit write enable signal transmitted to the scan data output circuit 27 is indicated as "BWEb".

In addition, the input latch 25 includes the register circuits that correspond to each data DI and each bit write enable signal BWE. In this embodiment, a master-slave flip-flop circuit 30 will be exemplified below as the register circuit corresponding to data DI, and a master-slave flip-flop circuit 31 will be exemplified below as the register circuit corresponding to bit write enable signal BWE. More specifically, the input latch 25 includes 32 flip-flop circuits 30 corresponding to the data DI (DI[0] to DI[31]), and includes 32 flip-flop circuits 31 corresponding to the bit write enable signals BWE (BWE[0] to BWE[31]).

Each flip-flop circuit 30 includes a master latch circuit 101 and a slave latch circuit 102.

In the normal operation mode and the scan mode, the master latch circuit 101 fetches the data DI based on the clock signal CLKLAT and outputs the data DIa to the slave latch circuit 102 and the write driver 26. Namely, the master latch circuit 101 can fetch the actual data (write data) and the scan data at the same input timing. More specifically, the data DI[0] is input to the data input terminal D of the master latch circuit 101 corresponding to the data DI[0], for example. The data output terminal Q of the master latch circuit 101 is coupled to the data input terminal D of the slave latch circuit 102 and the write driver 26. Also, the clock signal CLKLAT is input to the clock input terminal of the master latch circuit 101. The master latch circuit 101 fetches the data DI[0] in the period when the clock signal CLKLAT is at the "H" level, for example.

In the scan mode, the slave latch circuit 102 fetches the data DIa based on the sense amplifier enable signal SAE and outputs the data DIb to the scan data output circuit 27. More specifically, the output terminal of the slave latch circuit 102 corresponding to the data DI[0] is coupled to the scan data output circuit 27, for example. In the scan mode, the sense amplifier enable signal SAE is input to the clock input terminal of the slave latch circuit 102. The slave latch circuit 102 fetches the data DIa[0] output from the master latch circuit 101 in the period when the sense amplifier enable signal SAE is at the "H" level, for example.

Each flip-flop circuit 31 includes a master latch circuit 111 and a slave latch circuit 112.

In the normal operation mode and the scan mode, the master latch circuit 111, like the master latch circuit 101, fetches the bit write enable signal BWE based on the clock signal CLKLAT and outputs the bit write enable signal BWEa to the slave latch circuit 112 and the write driver 26. More specifically, the bit write enable signal BWE[0] is input to the data input terminal D of the master latch circuit 111 corresponding to the bit write enable signal BWE[0], for example. The data output terminal Q of the master latch circuit 111 is coupled to the data input terminal D of the slave latch circuit 112 and the write driver 26. Also, the clock signal CLKLAT is input to the clock input terminal of the master latch circuit 111. The master latch circuit 111 fetches the bit write enable signal BWE[0] in the period when the clock signal CLKLAT is at the "H" level, for example.

In the scan mode, the slave latch circuit 112, like the slave latch circuit 102, fetches the bit write enable signal BWEa based on the sense amplifier enable signal SAE and outputs the bit write enable signal BWEb to the scan data output circuit 27. More specifically, the output terminal of the slave latch circuit 112 corresponding to the bit write enable signal BWE[0] is coupled to the scan data output circuit 27, for example. In the scan mode, the sense amplifier enable signal SAE is input to the clock input terminal of the slave latch circuit 112. The slave latch circuit 112 fetches the bit write enable signal BWEa[0] output from the master latch circuit 111 in the period when the sense amplifier enable signal SAE is at the "H" level, for example.

The write enable signal WEn is input to the first input terminal of an OR circuit 41, the scan test enable signal STE is input to the second input terminal of the OR circuit 41, and the output terminal of the OR circuit 41 is coupled to the write driver 26. The OR circuit 41 transmits an "H" level signal to the write driver 26 if the scan test enable signal STE is at the "H" level (in the scan mode), and transmits the write enable signal WEn to the write driver 26 if the scan test enable signal is at the "L" level.

The write driver 26 writes data to the memory cell array 20 when the write enable signal WEn is in an enabled state. More specifically, the write driver 26 outputs write voltage to the column selector 22, namely, performs write operation according to the data DIa (write data) and the bit write enable signal BWEa received from the input latch 25.

The scan data output circuit 27 transmits the result of the logic operation of the data DIb (scan data) and the bit write enable signal BWEb to the output buffer 24 via the data line (bus) that couples the sense amplifier 23 with the output buffer 24, when the scan test enable signal is at the "H" level. For example, 32 scan data output circuits 27 are provided corresponding to the data DIb (DIb[0] to DIb[31]). The scan data output circuit 27 includes an XOR circuit 32 and an n-channel MOS transistor 33.

The first input terminal of the XOR circuit 32 is coupled to the data output terminal Q of the slave latch circuit 102, the second input terminal of the XOR circuit 32 is coupled to the data output terminal Q of the slave latch circuit 112, and the output terminal of the XOR circuit 32 is coupled to one end of the transistor 33. The XOR circuit 32 is provided for each data bit, performs XOR operation of the data DIb and the bit write enable signal BWEb, and transmits the result thereof to the transistor 33. For example, in the scan mode, if the bit write enable signal BWEb is at the "L" level, the XOR circuit 32 outputs the data DIb, namely, scan data to the transistor 33 as is.

The other end of the transistor 33 is coupled to the bus that couples the sense amplifier 23 with the output buffer 24. The scan test enable signal STE is input to the gate of the transistor 33. If the scan test enable signal STE is at the "H" level, the transistor 33 is turned on. The transistor 33 may be a p-channel MOS transistor.

The SAE selector 28 transmits an inverted signal of the sense amplifier enable signal SAE to the sense amplifier 23 if the scan test enable signal STE is at the "L" level. Also, the SAE selector 28 transmits the sense amplifier enable signal SAE to the input latch 25 if the scan test enable signal STE is at the "H" level. The SAE selector 28 includes AND circuits 34 and 35 and an inverter 36.

The inverted signal of the scan test enable signal STE is input to the first input terminal of the AND circuit 34, and the sense amplifier enable signal SAE is input to the second input terminal of the AND circuit 34. The output terminal of the AND circuit 34 is coupled to the input terminal of the inverter 36. The output terminal of the inverter 36 is coupled to the sense amplifier 23.

The scan test enable signal STE is input to the first input terminal of the AND circuit 35, and the sense amplifier enable signal SAE is input to the second input terminal of the AND circuit 35. The output terminal of the AND circuit 35 is coupled to the clock input terminals of the master latch circuits 101 and 111 of the input latch 25.

For example, if the scan test enable signal STE is at the "H" level, the "L" level is input to the first input terminal of the AND circuit 34. Therefore, the output of the AND circuit 34 is fixed at the "L" level. Accordingly, the "H" level is input to the sense amplifier 23 from the AND circuit 34 via the inverter 36. Also, the "H" level is input to the first input terminal of the AND circuit 35. Accordingly, the AND circuit 35 outputs the sense amplifier enable signal SAE. On the other hand, if the scan test enable signal STE is at the "L" level, the AND circuit 34 outputs the sense amplifier enable signal SAE. Accordingly, the inverted signal of the sense amplifier enable signal SAE is input to the sense amplifier 23 from the AND circuit 34 via the inverter 36. Also, the AND circuit 35 outputs the "L" level.

Accordingly, if the scan test enable signal is at the "H" level, namely, in the scan mode, the scan data is transmitted to the output buffer 24 from the slave latch circuit 102 via the scan data output circuit 27 based on the sense amplifier enable signal SAE. On the other hand, if the scan test enable signal is at the "L" level, namely, in the normal operation mode, the data read from the memory cell array 20 is transmitted to the output buffer 24 from the sense amplifier 23 based on the sense amplifier enable signal SAE.

The CLK controller 29 controls the clock signal CLKLAT. More specifically, the CLK controller 29 outputs the clock signal CLK as the clock signal CLKLAT in the period when the chip enable signal CEn is being asserted, or in the period when the scan test enable signal STE is at the "H" level, namely, in the period of the normal operation mode and the scan mode period. The CLK controller 29 includes inverters 37 and 38, an OR circuit 39, and a NAND circuit 40.

The chip enable signal CEn is input to the input terminal of the inverter 37. The output terminal of the inverter 37 is coupled to the first input terminal of the OR circuit 39. The scan test enable signal STE is input to the second input terminal of the OR circuit 39. The output terminal of the OR circuit is coupled to the first input terminal of the NAND circuit 40.

The clock signal CLK is input to the input terminal of the inverter 38. The output terminal of the inverter 38 is coupled to the second input terminal of the NAND circuit 40. The output terminal of the NAND circuit 40 is coupled to the clock input terminals of the master latch circuits 101 and 111 of the input latch 25.

For example, if the chip enable signal CEn is being asserted at the "L" level, or if the scan test enable signal STE is set to the "H" level, the OR circuit 39 outputs the "H" level. As a result of this, the NAND circuit 40 outputs the clock signal CLKLAT according to the inverted signal of the clock signal CLK.

1.3 Configuration of Memory Cell Array

Figure 3:
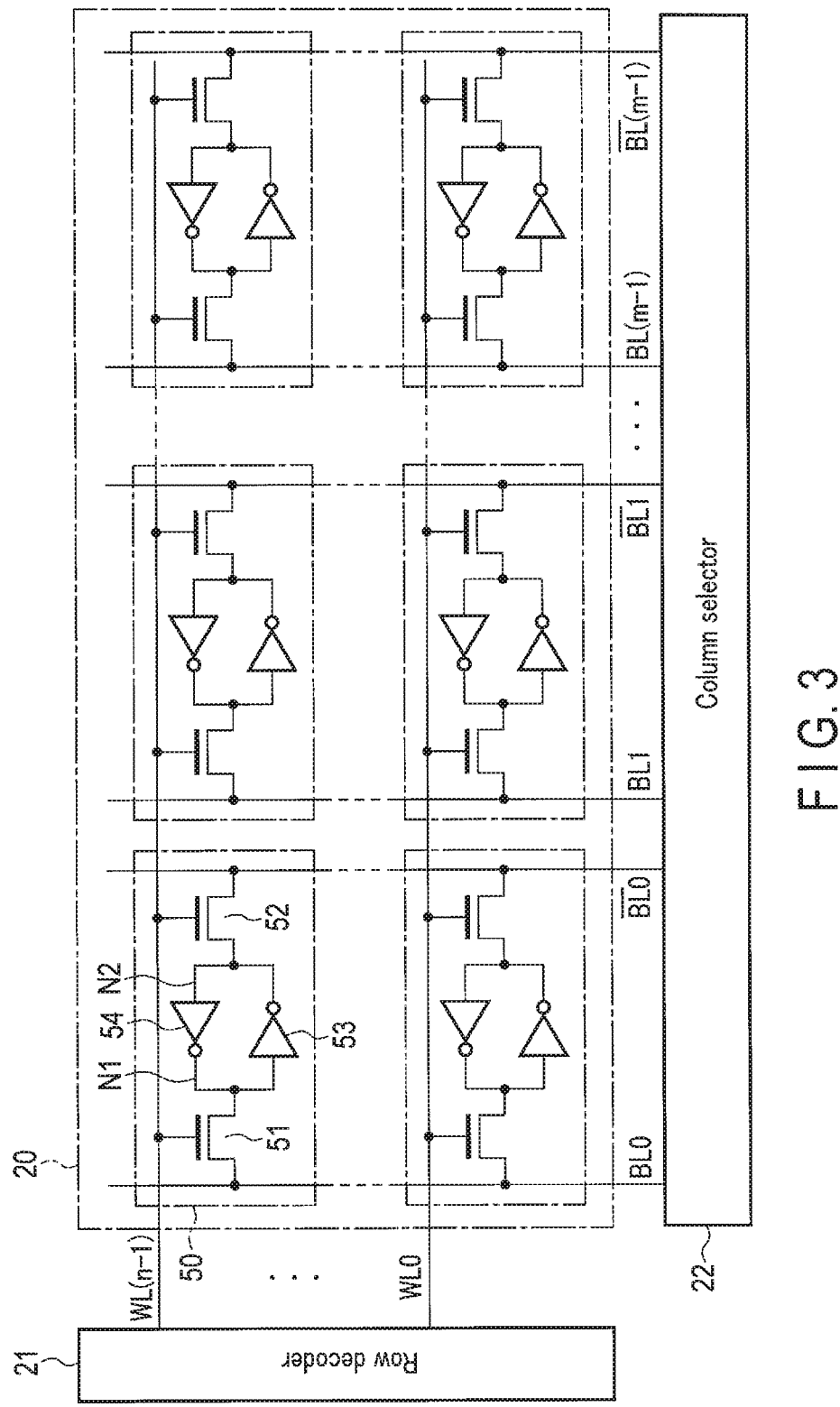
FIG. 3 is a circuit diagram of a memory cell array included in the semiconductor integrated circuit according to the first embodiment.

Next, the configuration of the memory cell array 20 will be described with reference to FIG. 3. The example in FIG. 3 shows the memory cell array 20 that corresponds to 1-bit data output. A memory cell array 20 having the same circuit configuration is provided according to the number of input-output data bits.

As shown in FIG. 3, the memory cell array 20 comprises a plurality of SRAM bit cells 50 that are arranged in a matrix. The number of SRAM bit cells 50 may be set as one chooses. The SRAM bit cells 50 arranged in the same row are coupled, in a shared manner, to one of the plurality of word lines WL (WL0, . . . , WL(n−1)) (wherein n is an integer of 1 or more) extending in the row direction. The plurality of word lines WL are coupled to the row decoder 21. The SRAM bit cells 50 arranged in the same column are coupled, in a shared manner, to one of the plurality of bit line pairs BL and /BL (BL0 and /BL0, BL1 and /BL1, . . . , BL(m−1) and /BL(m−1)) (wherein m is an integer of 2 or more) extending in the column direction. The plurality of bit line pairs BL and /BL are coupled to the column selector 22. The bit line pair BL0 and /BL0 corresponds to column 0, and the bit line pair BL1 and /BL1 corresponds to column 1. The same applies to the other columns: the bit line pair BL(m−1) and /BL(m−1) corresponds to column(m−1).

Each of the SRAM bit cells 50 comprises two n-channel MOS transistors 51 and 52 and two inverters 53 and 54.

One end of the transistor 51 is coupled to one of the paired bit lines (bit line BL), and the other end of the transistor 51 is coupled to the node N1 in the SRAM bit cell 50. The gate of the transistor 51 is coupled to the word line WL. One end of the transistor 52 is coupled to the other of the paired bit lines (bit line /BL), and the other end of the transistor 52 is coupled to the node N2 in the SRAM bit cell 50. The gate of the transistor 52, like the gate of the transistor 51, is coupled to the word line WL. The transistors 51 and 52 function as transfer gate transistors.

The input terminal of the inverter 53 is coupled to the node N1, and the output terminal of the inverter 53 is coupled to the node N2. The input terminal of the inverter 54 is coupled to the node N2, and the output terminal of the inverter 54 is coupled to the node N1. Thereby, the inverted data of the data stored in the node N1 is stored in the node N2. Hereinafter, it is assumed that if the node N1 is at the "H" level, the SRAM bit cell 50 stores the "H" level ("1" data), and that if the node N1 is at the "L" level, the SRAM bit cell 50 stores the "L" level ("0" data).

1.4 Flow of Data in Memory Macro in Normal Operation Mode

Next, the flow of the data in the memory macro 10 in the normal operation mode will be described with reference to FIG. 4. In a manner similar to FIG. 2, in the example shown in FIG. 4, only the blocks that correspond to the data DI[0] and the bit write enable signal BWE[0] are indicated in the input latch 25, to simplify the description.

As shown in FIG. 4, in the normal operation mode, the scan test enable signal STE is set to the "L" level. Thereby, the transistor 33 in the scan data output circuit 27 is turned off. Also, the SAE selector 28 transmits the sense amplifier enable signal SAE to the sense amplifier 23. The chip enable signal CEn at the "L" level is input to the CLK controller 29. Thereby, the CLK controller 29 transmits the clock signal CLKLAT (i.e., clock signal CLK) to the input latch 25.

In the case of asserting the write enable signal WEn at the "L" level and performing the write operation in this state, for example, the write data is input to the input latch 25. The input latch 25 transmits the data DIa[0] and the bit write enable signal BWEa[0] to the write driver 26 based on the clock signal CLKLAT. At this time, since the clock input terminals of the slave latch circuits 102 and 112 are fixed at the "L" level, the changed values of the data DIb[0] and the bit write enable signal BWEb[0] are not output from the input latch 25 to the scan data output circuit 27.

In the case of performing the write operation, the write enable signal WEn at the "L" level is input to the write driver 26, so that the write driver 26 is in operation. The write driver 26 applies the write voltage based on the data DIa[0] and the bit write enable signal BWEa[0] to the memory cell array 20 via the column selector 22.

Also, in the case of performing the read operation, for example, the sense amplifier 23 transmits the read data to the output buffer 24 based on the sense amplifier enable signal SAE. The output buffer 24 transmits the readout data to the logic circuit 11.

1.5 Flow of Data in Memory Macro in Scan Mode

Next, the flow of the data in the memory macro 10 in the scan mode will be described with reference to FIG. 5. In a manner similar to FIG. 2, in the example shown in FIG. 5, only the blocks that correspond to the data DI[0] and the bit write enable signal BWE[0] are indicated in the input latch 25, to simplify the description.

As shown in FIG. 5, in the scan mode, the scan test enable signal STE is set to the "H" level. Thereby, the transistor 33 in the scan data output circuit 27 is turned on. Also, the SAE selector 28 transmits the sense amplifier enable signal SAE to the input latch 25. Moreover, the CLK controller 29 transmits the clock signal CLKLAT (i.e., clock signal CLK) to the input latch 25 regardless of the chip enable signal CEn.

In the case of performing the scan test in this state, the scan data is input to the input latch 25. The input latch 25 transmits the data DIb[0] and the bit write enable signal BWEb[0] to the scan data output circuit 27 based on the sense amplifier enable signal SAE. The scan data output circuit 27 transmits the result of the XOR operation of the data DIb[0] and the bit write enable signal BWEb[0] to the output buffer 24.

In the scan mode, since the scan test enable signal STE at the "H" level is input to the OR circuit 41, the output of the OR circuit 41 is fixed at the "H" level. As such, the write driver 26 is in a non-operation state. Namely, the write voltage is not output from the write driver 26 regardless of the state of the write enable signal WEn. Accordingly, the write enable signal WEn may be asserted at the "L" level.

Also, since the sense amplifier enable signal SAE is not input to the sense amplifier 23, data is not transmit from the sense amplifier 23 to the output buffer 24.

1.6 Advantageous Effects of Present Embodiment

The configuration according to the present embodiment can improve the test quality. The advantageous effects of the present embodiment will be described below.

There is a case where the scan test of the logic circuit around the memory is performed in the semiconductor integrated circuit incorporating the memory, without accessing the memory. For example, in the case of performing the logic test of the system around the memory macro, the scan test is performed in the state where a scan chain that bypasses the memory cell array and passes through the flip-flop circuit for the scan test, for example, is formed in the memory macro. In this case, the circuit for the scan test may be configured as a soft macro in a Wrapper module of the memory, or may be incorporated into the memory macro in the form of hardware.

The data path differs between the normal operation and the scan test. As such, the input-output timing of the data in the memory macro differs between the normal operation and the scan test. For example, even if the timing at which data is input to the memory macro in the normal operation and that in the scan test are matched with each other, the output timing in the scan test where the memory is not accessed is often earlier than that in the normal operation where the memory is accessed. If the output timing differs, it is hard to evaluate the operation speed by the scan test, making it impossible to guarantee the quality concerning the operation speed.

In addition, if the input-output timing differs between the normal operation and the scan test, the timing design of the semiconductor integrated circuit will be difficult. For example, attempting to input a clock signal having a higher (or lower) frequency than that of the normal operation at the time of the scan test in accordance with the input-output timing lag takes time and effort in clock design, and it is hard to match all the timing. Moreover, an actual operation speed cannot be tested.

By contrast, in the configuration according to the present embodiment, the master-slave flip-flop circuit that includes the master latch circuit and the slave latch circuit is used for the input buffer in the memory macro. The master latch circuit can fetch the actual data (e.g., write data) and the scan data based on the same timing of the clock signal CLKLAT. In the normal operation mode, the write data is transmitted from the master latch circuit to the write driver; and in the scan mode, the scan data is transmitted from the master latch circuit to the output buffer via the slave latch circuit. By operating the slave latch circuit based on the sense amplifier enable signal, the scan data can be output from the slave latch circuit almost at the same timing as the case where the read data is output from the sense amplifier. Namely, in the memory macro, the input-output timing can be almost the same in the normal operation and in the scan test. This makes it easy to evaluate the operation speed by the scan test, and can improve the test quality.

In addition, since the test quality can be improved, the sensitivity for detecting a defective chip at a time of shipping inspection, for example, can be improved. Accordingly, the defect rate of products that are shipped can be reduced.

Moreover, since in the configuration according to the present embodiment, the input-output timing in the memory macro is almost the same at the time of the normal operation where the memory is accessed and at the time of the scan test, the burden of timing adjustment in chip design can be reduced. Accordingly, the development period related to design can be shortened.

2. Second Embodiment

Next, the second embodiment will be described. In the second embodiment, a case of reading the data corresponding to the scan data from the memory cell array 20 to output it will be described. In the following, only the matters different from the first embodiment will be described.

2.1 Configuration of Memory Macro

First, the configuration of the memory macro 10 will be described with reference to FIG. 6. In the example shown in FIG. 6, the column decoder 19, the SAE selector 28, the CLK controller 29, and the OR circuit 41 that are described in FIG. 2 of the first embodiment are omitted to simplify the description. Accordingly, the signal input from the SAE selector 28 to the sense amplifier 23 and the signal input from the OR circuit 41 to the write driver 26 are omitted. Also, in the example shown in FIG. 6, the scan data output circuit 27 is removed. Furthermore, only the latch circuits that correspond to the data DI[0] and the bit write enable signal BWE[0] are indicated in the input latch 25, to simplify the description. The other latch circuits corresponding to the data DI[1] to DI[31] and the bit write enable signals BWE[1] to BWE[31] also have the same configuration.

Figure 6:
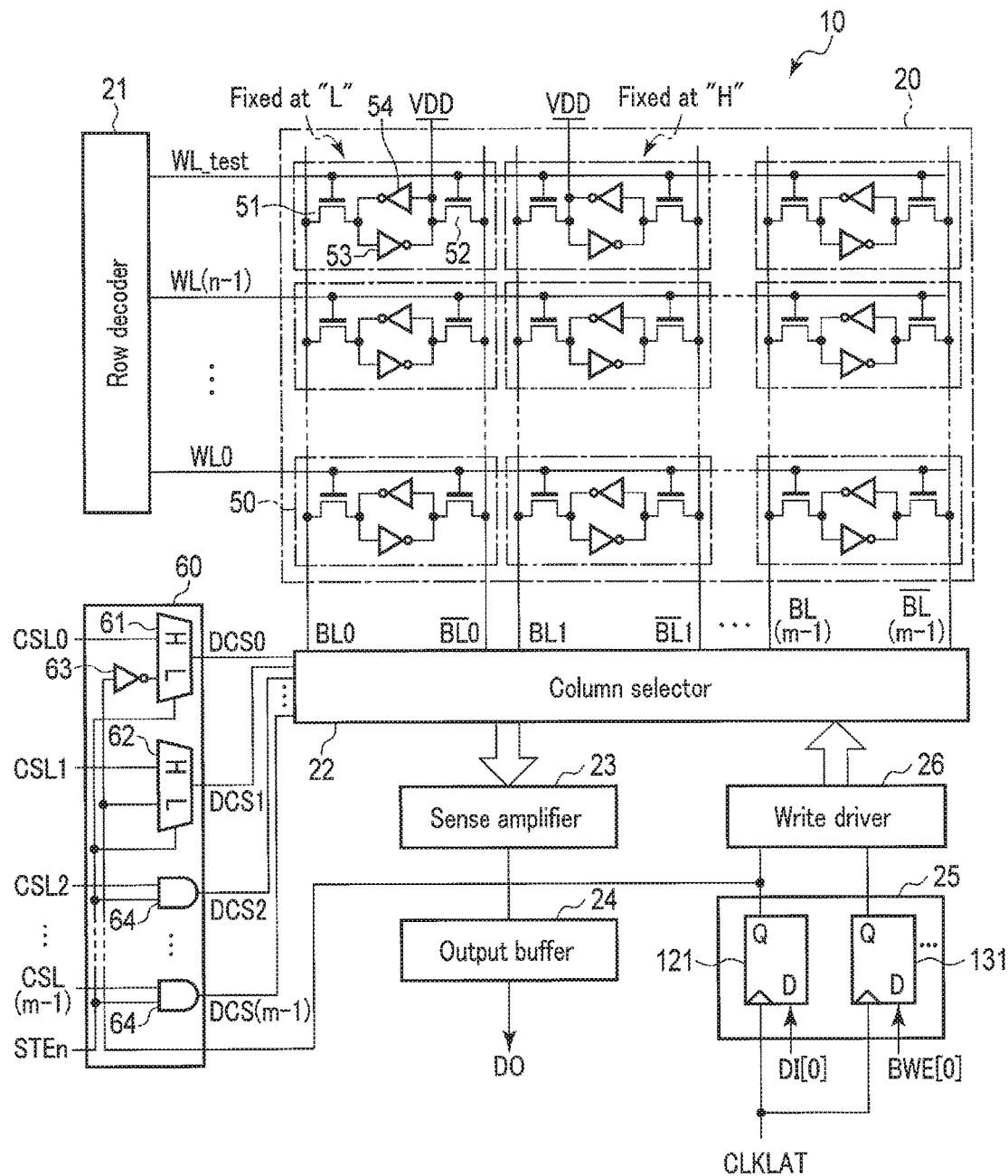
FIG. 6 is a block diagram of a semiconductor integrated circuit according to a second embodiment.

As shown in FIG. 6, the memory macro 10 includes a memory cell array 20, row decoder 21, column selector 22, sense amplifier 23, output buffer 24, input latch 25, write driver 26, and DCS generator 60. The column selector 22, sense amplifier 23, output buffer 24, and write driver 26 are the same as those shown in FIG. 2 of the first embodiment.

In addition to the configuration of the memory cell array 20 described in FIG. 3 of the first embodiment, the memory cell array 20 is provided with a word line WL_test for scan test and a row of a plurality (m) of SRAM bit cells 50 coupled thereto. The word line WL_test, like the other word lines WL, is coupled to the row decoder 21. In this embodiment, the data of the SRAM bit cell 50 coupled to the word line WL_test and coupled to the bit line pair BL0 and /BL0 is fixed at the "L" level. Also, the data of the SRAM bit cell 50 coupled to the word line WL_test and coupled to the bit line pair BL1 and /BL1 is fixed at the "H" level. In the case of fixing the data of the SRAM bit cell 50 at the "L" level, for example, power-supply voltage VDD is applied to the node N2 in the SRAM bit cell 50. Also, in the case of fixing the data of the SRAM bit cell 50 at the "H" level, for example, the power-supply voltage VDD is applied to the node N1 in the SRAM bit cell 50.

The column selector 22 selects a corresponding column based on signals DCS (DCS0 to DCS(m−1)) transmitted from the DCS generator 60. The signals DCS0 to DCS(m−1) correspond to column 0 to column (m−1), respectively, and a corresponding column is selected at the time of the "H" level, for example.

The input latch 25 includes the register circuits that correspond to each data DI and each bit write enable signal BWE. In this embodiment, a latch circuit 121 will be exemplified below as the register circuit corresponding to data DI, and a latch circuit 131 will be exemplified below as the register circuit corresponding to bit write enable signal BWE. More specifically, the input latch 25 includes 32 latch circuits 121 corresponding to the data DI (DI[0] to DI[31]), and includes 32 latch circuits 131 corresponding to the bit write enable signals BWE (BWE[0] to BWE[31]).

The data DI[0] is input to the data input terminal D of the latch circuit 121 corresponding to the data DI[0], for example. The data output terminal Q of the latch circuit 121 is coupled to the DCS generator 60 and the write driver 26.

Also, the clock signal CLKLAT is input to the clock input terminal of the latch circuit 121. The latch circuit 121 fetches the data DI[0] in the period when the clock signal CLKLAT is at the "H" level, for example.

The bit write enable signal BWE[0] is input to the data input terminal D of the latch circuit 131 corresponding to the bit write enable signal BWE[0], for example. The data output terminal Q of the latch circuit 131 is coupled to the write driver 26. Also, the clock signal CLKLAT is input to the clock input terminal of the latch circuit 131. The latch circuit 131 fetches the bit write enable signal BWE[0] in the period when the clock signal CLKLAT is at the "H" level, for example.

The DCS generator 60 generates the signals DCS (DCS0 to DCS(m−1)) based on column selection signals CSL (CSL0 to CSL(m−1)), scan test enable signal STEn, and scan data, and transmits them to the column selector 22. The column selection signals CSL are provided from the column decoder 19. The column selection signals CSL0 to CSL(m−1) are based on the result of decoding the column address by the column decoder 19, and correspond to column 0 to column (m−1), respectively. The scan test enable signal STEn is an inverted signal of the scan test enable signal STE and is provided from the logic circuit 11, for example. The logic circuit 11 sets the scan test enable signal STEn to the "H" level in the normal operation mode and sets the scan test enable signal STEn to the "L" level in the scan mode. For example, in the normal operation mode, the DCS generator 60 outputs the column selection signal CSL as the signal DCS. On the other hand, in the scan mode, the DCS generator 60 generates the signal DCS that is based on the scan data, and transmits it.

The DCS generator 60 includes two multiplexers 61 and 62, inverter 63, and (m−2) AND circuits 64.

The column selection signal CSL0 is input to the first input terminal of the multiplexer 61, and the scan data (output data of the slave latch circuit 102) inverted by the inverter 63 is input to the second input terminal of the multiplexer 61. The signal output from the multiplexer 61 is input to the column selector 22 as the signal DCS0. The multiplexer 61 selects the first input terminal if the scan test enable signal STEn is at the "H" level, and selects the second input terminal if the scan test enable signal STEn is at the "L" level. Accordingly, the multiplexer 61 outputs the column selection signal CSL0 in the normal operation mode, and outputs the inverted signal of the scan data in the scan mode. If the scan data is at the "L" level in the scan mode, the signal DCS0 is set to the "H" level, and the column 0 is selected by the column selector 22. On the other hand, if the scan data is at the "H" level, the signal DCS0 is set to the "L" level, and the column 0 is not selected by the column selector 22.

The column selection signal CSL1 is input to the first input terminal of the multiplexer 62, and the scan data is input to the second input terminal of the multiplexer 62. The signal output from the multiplexer 62 is input to the column selector 22 as the signal DCS1. The multiplexer 62, like the multiplexer 61, selects the first input terminal if the scan test enable signal STEn is at the "H" level, and selects the second input terminal if the scan test enable signal STEn is at the "L" level. Accordingly, the multiplexer 62 outputs the column selection signal CSL1 in the normal operation mode, and outputs the scan data in the scan mode. For example, in the scan mode, if the scan data is at the "H" level, the signal DCS1 is set to the "H" level, and the column 1 is selected by the column selector 22. On the other hand, if the scan data is at the "L" level, the signal DCS1 is set to the "L" level, and the column 1 is not selected by the column selector 22.

The (m−2) AND circuits 64 correspond to the signals DCS2 to DCS(m−1), respectively. One of the column selection signals CSL2 to CSL(m−1) is input to the first input terminal of the AND circuit 64, and the scan test enable signal STEn is input to the second input terminal of the AND circuit 64. The signal output from the AND circuit 64 is input to the column selector 22 as one of the signals DCS2 to DCS(m−1). The AND circuit 64 outputs the column selection signals CSL (CSL2 to CSL(m−1)) if the scan test enable signal STEn is at the "H" level, and outputs the "L" level if the scan test enable signal STEn is at the "L" level.

2.2 Flow of Data in Memory Macro in Scan Mode

Next, the flow of the data in the memory macro 10 in the scan mode will be described with continued reference to FIG. 6.

In the scan mode, the row decoder 21 selects the word line WL_test. Also, the scan test enable signal STEn is set to the "L" level.

If the scan data is at the "L" level in this state, the DCS generator 60 sets the signal DCS0 to the "H" level and sets the signals DCS1 to DCS(m−1) to the "L" level. Then, the column selector 22 selects the column 0. Since the SRAM bit cell 50 coupled to the word line WL_test and the bit line pair BL0 and /BL0 is fixed at the "L" level, the sense amplifier 23 reads out the "L" level data.

On the other hand, if the scan data is at the "H" level, the DCS generator 60 sets the signal DCS1 to the "H" level and sets the signals DCS0 and DCS2 to DCS(m−1) to the "L" level. Then, the column selector 22 selects the column 1. Since the SRAM bit cell 50 coupled to the word line WL_test and the bit line pair BL1 and /BL1 is fixed at the "H" level, the sense amplifier 23 reads out the "H" level data.

Namely, if the scan data is at the "L" level, the "L" data is read from the memory cell array 20. If the scan data is at the "H" level, the "H" data is read from the memory cell array 20.

2.3 Advantageous Effects of Present Embodiment

The configuration according to the present embodiment achieves the same advantageous effects as those of the first embodiment.

Moreover, in the present embodiment, the memory cell array 20 is provided with the SRAM bit cell to which data is fixed for the scan test, and the data of the SRAM bit cell can be read based on the scan data. Thereby, in the case of outputting the scan data from the memory macro as well, it is possible to output the data read from the memory cell array, as in the normal operation mode. Namely, in the scan mode as well, it is possible to access the memory and output the read data, as in the normal operation. Accordingly, it is possible to further reduce the input-output timing lag between the normal operation and the scan test in the memory macro.

3. Third Embodiment

Next, the third embodiment will be described. In the third embodiment, a case of performing the scan test using the plurality of register circuits which are coupled in serial to each other will be described. In the following, only the matters different from the first and second embodiment will be described.

3.1 Configuration of Input Latch

The configuration of the input latch 25 will be described with reference to FIG. 7. In the example shown in FIG. 7, the register circuits that correspond to the bit write enable signals BWE are omitted to simplify the description. The configuration of the register circuit corresponding to the bit write enable signal BWE is the same as the configuration of the register circuit corresponding to the data DI.

As shown FIG. 7, the input latch 25 includes the register circuits corresponding to the data DI[1] to DI[31]. Each of the register circuits corresponding to the data DI includes the master-slave flip-flop circuit 30 and a multiplexer 201.

The scan data is input to the first input terminal of the multiplexer 201, and the data DI corresponding to the write data is input to the second input terminal of the multiplexer 201. The output terminal of the multiplexer 201 is coupled to the data input terminal D of the master latch circuit 101. For example, the multiplexer 201 output the scan data if the scan test enable signal STE is at the "H" level, and the multiplexer 201 output the data DI if the scan test enable signal STE is at the "L" level.

The configuration of the master-slave flip-flop circuit 30 is the same as the configuration in the first embodiment. The data input terminal D of the master latch circuit 101 is coupled to the output terminal of the multiplexer 201. The data output terminal Q of the master latch circuit 101 is coupled to the data input terminal D of the slave latch circuit 102 and the write driver 26. Also, the clock signal CLKLAT is input to the clock input terminal of the master latch circuit 101.

The output terminal of the slave latch circuit 102 is coupled to the scan data output circuit 27 and the first input terminal of the multiplexer 201 corresponding to a next data DI. Also, the clock signal SAE is input to the clock input terminal of the slave latch circuit 102. More specifically, the output terminal of the slave latch circuit 102 corresponding to the data DI[O] is coupled to the first input terminal of the multiplexer 201 corresponding to the data DI[1]. The output terminal of the slave latch circuit 102 corresponding to the data DI[1] is coupled to the first input terminal of the multiplexer 201 corresponding to the data DI[2]. In this manner, the output terminal of the slave latch circuit 102 corresponding to the data DI[2] to DI[30] is coupled to the first input terminal of the multiplexer 201 corresponding to the data DI[3] to DI[31]. Thereby, the register circuits 200 corresponding to the data DI[0] to DI[31] are coupled in serial to each other. Note that the register circuits corresponding to the bit write enable signals BWE[0] to BWE[31] are coupled in serial to each other in the same manner.

In case of the scan test, the scan test enable signal STE is at the "H" level. In the multiplexer 201, the first input terminal is electrically coupled to the output terminal. In this case, the register circuits 200, that is, the master latch circuits 101 and the slave latch circuits 102 are coupled in serial to each other. The scan data which is input (from "Scan_in") to the first input terminal of the multiplexer 201 corresponding to the data DI[0] is output (to "Scan_out") from the output terminal of the slave latch circuit 102 corresponding to the data DI[31], via the register circuits 200 corresponding to the data DI[0] to DI[31] which are coupled in serial to each other. Also, each of the slave latch circuits 102 transmits the scan data to the scan data output circuit 27.

In case of the normal operation mode, the scan test enable signal STE is at the "L" level. In the multiplexer 201, the second input terminal is electrically coupled to the output terminal. In this case, each of the register circuits 200 transmits the data DI to the write driver 26.

3.2 Advantageous Effects of Present Embodiment

The configuration according to the present embodiment achieves the same advantageous effects as those of the first and second embodiment.

Moreover, in the present embodiment, the register circuits in the latch circuit 25 can be coupled in serial to each other in the scan test.

4. Modification, Etc.

The semiconductor integrated circuit according to the above embodiments includes the logic circuit (11 shown in FIG. 1) and the memory macro (10 shown in FIG. 1) coupled to the logic circuit. The memory macro includes: the memory cell array (20 shown in FIG. 2) including the memory bit cell; the output buffer (24 shown in FIG. 2) coupled to the logic circuit; the sense amplifier (23 shown in FIG. 2) configured to output data read from the memory cell array to the output buffer based on a first clock signal (SAE); the write driver (26 shown in FIG. 2) configured to apply a write voltage to the memory cell array based on an asserted write control signal (WEn); and the first flip-flop circuit (30 shown in FIG. 2) configured to fetch first input data from the logic circuit based on a second clock signal (CLKLAT), output the first input data to the write driver based on the second clock signal in a write operation based on the asserted write control signal, and output the first input data to the output buffer based on the first clock signal in a scan test of the logic circuit.

By applying the above embodiments, it is possible to provide a semiconductor integrated circuit that can improve the test quality.

The embodiments are not limited to the above-described aspects, and can be modified in various ways.

Also, the memory shown in the above embodiments is not limited to a SRAM. Any memory may be employed as long as it is a writable and readable memory. In addition, the semiconductor integrated circuit may be a CPU (central processing unit), may be a hardware engine of a GPU (graphics processing unit), a DSP (digital signal processor), etc., or may be a SoC (system on chip) that includes them.

Furthermore, the second and third embodiments may be combined. For example, the latch circuits 121 corresponding to the data DI[0] to DI[31] may be coupled in serial to each other in the scan test.

Furthermore, the term "couple" or "connect" in the above embodiments includes a state of indirect coupling via a transistor or a resistance, etc.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
 a logic circuit; and
 a memory macro coupled to the logic circuit,
 wherein the memory macro includes:
  a memory cell array including a memory bit cell;
  an output buffer coupled to the logic circuit;
  a sense amplifier configured to output data read from the memory cell array to the output buffer based on a first clock signal;
  a write driver configured to apply a write voltage to the memory cell array based on an asserted write control signal; and
  a first register circuit configured to fetch first input data from the logic circuit based on a second clock signal, output the first input data to the write driver based on the second clock signal in a write operation based on the asserted write control signal, and output the first input data to the output buffer based on the first clock signal in a scan test of the logic circuit.

2. The circuit according to claim 1, wherein the memory macro further includes a second register circuit configured to fetch second input data from the logic circuit based on the second clock signal, output the second input data to the write driver based on the second clock signal in the write operation based on the asserted write control signal, and output the second input data to the output buffer based on the first clock signal in the scan test of the logic circuit, and
the first and second register circuits are coupled in serial to each other in the scan test.

3. The circuit according to claim 1, wherein the first register circuit includes:
a first latch circuit including a data input terminal which is coupled to the logic circuit, a clock input terminal to which the second clock signal is input, and a data output terminal which is coupled to the write driver; and
a second latch circuit including a data input terminal which is coupled to the data output terminal of the first latch circuit, a clock input terminal to which the first clock signal is input, and a data output terminal which is coupled to the output buffer.

4. The circuit according to claim 3, wherein the first register circuit is a master-slave flip-flop circuit, the first latch circuit is a master latch circuit, and the second latch circuit is a slave latch circuit.

5. The circuit according to claim 1, wherein the memory macro further includes a second register circuit configured to fetch a bit write control signal from the logic circuit based on the second clock signal, output the bit write control signal to the write driver based on the second clock signal in the write operation, and output the bit write control signal to the write driver based on the first clock signal in the scan test.

6. The circuit according to claim 5, wherein the memory macro further includes a scan data propagation controller configured to perform logic operation of the first input data which is output from the first register circuit in the scan test and the bit write control signal which is output from the second register circuit in the scan test, and transmit a result of the logic operation of the first input data and the bit write control signal to the output buffer.

7. The circuit according to claim 6, wherein the scan data propagation controller receives a scan test enable signal, transmits the result of the logic operation of the first input data and the bit write control signal to the output buffer if the scan test enable signal is asserted, and does not transmit the result of the logic operation of the first input data and the bit write control signal to the output buffer if the scan test enable signal is negated.

8. The circuit according to claim 5, wherein the second register circuit includes:
a third latch circuit including a data input terminal which is coupled to the logic circuit and to which the bit write control signal is input, a clock input terminal to which the second clock signal is input, and a data output terminal which is coupled to the write driver; and
a fourth latch circuit including a data input terminal which is coupled to the data output terminal of the third latch circuit, a clock input terminal to which the first clock signal is input, and a data output terminal which is coupled to the output buffer.

9. The circuit according to claim 8, wherein the second register circuit is a master-slave flip-flop circuit, the third latch circuit is a master latch circuit, and the fourth latch circuit is a slave latch circuit.

10. The circuit according to claim 1, wherein the memory macro further includes a clock controller configured to control the second clock signal according to a chip enable signal and a scan test enable signal, and
the clock controller outputs the second clock signal if at least one of the chip enable signal and the scan test enable signal is asserted.

11. The circuit according to claim 10, wherein the memory macro further includes a second circuit configured to transmit a signal based on the first clock signal to the sense amplifier if the scan test enable signal is negated, and transmit the first clock signal to the first register circuit if the scan test enable signal is asserted.

12. The circuit according to claim 1, wherein the memory macro further includes a first circuit configured to receive the write control signal and a scan test enable signal, and transmits a result of logic operation of the write control signal and the scan test enable signal to the write driver.

13. A semiconductor integrated circuit comprising:
a logic circuit; and
a memory macro coupled to the logic circuit,
wherein the memory macro includes:
a memory cell array including a first memory bit cell storing data of a first logic level and a second memory bit cell storing data of a second logic level;
first and second bit line pairs coupled to the first and second memory bit cells, respectively;
a sense amplifier configured to output data read from the memory cell array based on a first clock signal;
a signal generator configured to generate a column control signal;
a selector configured to couple at least one of the first and second bit line pairs with the sense amplifier based on the column control signal;
a write driver configured to apply a write voltage to the memory cell array based on an asserted write control signal; and
a register circuit configured to fetch input data from the logic circuit based on a second clock signal, output the input data to the write driver and the signal generator,
if the input data which is output from the register circuit is at the first logic level in a scan test, the selector couples the first bit line pair with the sense amplifier, and the sense amplifier reads the data of the first logic level from the first memory bit cell, and
if the input data which is output from the register circuit is at the second logic level in the scan test, the selector couples the second bit line pair with the sense amplifier, and the sense amplifier reads the data of the second logic level from the second memory bit cell.

14. The circuit according to claim 13, wherein the register circuit includes:
a first latch circuit including a data input terminal which is coupled to the logic circuit, a clock input terminal to which the first clock signal is input, and a data output terminal which is coupled to the write driver and the signal generator; and
a second latch circuit including a data input terminal to which the bit write enable signal is input, a clock input terminal to which the first clock signal is input, and an output terminal which is coupled to the write driver.

15. The circuit according to claim 13, wherein the signal generator is configured to generate the column control signal based on a column selection signal, a scan test enable signal, and an output signal of the register circuit, and
   the selector is capable of selecting one of the first and second bit line pairs based on the column selection signal in the scan test.

16. The circuit according to claim 13, wherein the memory macro further includes:
   a word line coupled to the first and second memory bit cells; and
   a row decoder coupled to the word line, and
   the row decoder selects the word line coupled to the first and second memory bit cells in the scan test, and does not select the word line in the write operation.

* * * * *